United States Patent
Kim et al.

(10) Patent No.: US 11,871,594 B2
(45) Date of Patent: Jan. 9, 2024

(54) ELECTROLUMINESCENT DEVICE, AND DISPLAY DEVICE COMPRISING THEREOF

(71) Applicant: SAMSUNG ELECTRONICS CO., LTD., Suwon-si (KR)

(72) Inventors: Sung woo Kim, Hwaseong-si (KR); Moon Gyu Han, Suwon-si (KR); Eun joo Jang, Suwon-si (KR); Kun su Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/047,675

(22) Filed: Oct. 19, 2022

(65) Prior Publication Data

US 2023/0061360 A1 Mar. 2, 2023

Related U.S. Application Data

(63) Continuation of application No. 17/079,319, filed on Oct. 23, 2020, now Pat. No. 11,495,766.

(30) Foreign Application Priority Data

Oct. 24, 2019 (KR) .................. 10-2019-0132890

(51) Int. Cl.
*H01L 51/50* (2006.01)
*H10K 50/165* (2023.01)
(Continued)

(52) U.S. Cl.
CPC ............ *H10K 50/165* (2023.02); *C09K 11/88* (2013.01); *H10K 50/115* (2023.02); *H10K 50/15* (2023.02);
(Continued)

(58) Field of Classification Search
CPC .................. H10K 50/165; H10K 50/115
See application file for complete search history.

(56) References Cited

U.S. PATENT DOCUMENTS

| 2003/0186479 A1 | 10/2003 | Kim et al. |
| 2015/0076494 A1 | 3/2015 | Pickett et al. |
| 2019/0081262 A1 | 3/2019 | Kim et al. |

FOREIGN PATENT DOCUMENTS

| CN | 107452884 A | 12/2017 |
| CN | 109935705 A | 6/2019 |

(Continued)

OTHER PUBLICATIONS

Aqiang Wang, et al., Bright, efficient, and color-stable violet ZnSe-based quantum dot light-emitting diodes, Nanoscale, 2015, 7, 2951-2959.

(Continued)

*Primary Examiner* — Anthony Ho
(74) *Attorney, Agent, or Firm* — CANTOR COLBURN LLP

(57) ABSTRACT

An electroluminescent device and a display device including the electroluminescent device. The electroluminescent device includes a first electrode and a second electrode each having a surface opposite the other; a light emitting layer disposed between the first electrode and the second electrode, the light emitting layer including quantum dots; and an electron transport layer disposed between the light emitting layer and the second electrode, the electron transport layer including inorganic material nanoparticles including an anion dopant including P, N, C, Cl, F, Br, S, or a combination thereof.

18 Claims, 8 Drawing Sheets

(51) Int. Cl.
    *C09K 11/88*     (2006.01)
    *H10K 50/15*     (2023.01)
    *H10K 50/17*     (2023.01)
    *H10K 50/18*     (2023.01)
    *H10K 50/115*     (2023.01)
    *H10K 50/16*     (2023.01)
    *H10K 85/60*     (2023.01)
    *G09G 3/32*     (2016.01)
    *H10K 101/30*     (2023.01)
    *H10K 102/00*     (2023.01)

(52) U.S. Cl.
    CPC ........... *H10K 50/166* (2023.02); *H10K 50/17* (2023.02); *H10K 50/171* (2023.02); *H10K 50/18* (2023.02); *H10K 85/60* (2023.02); *G09G 3/32* (2013.01); *G09G 2310/0267* (2013.01); *G09G 2310/0272* (2013.01); *H10K 2101/30* (2023.02); *H10K 2102/331* (2023.02)

(56) References Cited

FOREIGN PATENT DOCUMENTS

| | | |
|---|---|---|
| CN | 109980097 A | 7/2019 |
| KR | 0515669 B1 | 9/2005 |
| KR | 1656927 B1 | 9/2016 |
| KR | 1878615 B1 | 7/2018 |
| KR | 1883891 B1 | 8/2018 |
| KR | 20190029470 A | 3/2019 |
| KR | 1980979 B1 | 5/2019 |

OTHER PUBLICATIONS

Dr. S. D. Miao, et al., Small, 2013, 8 pp.
Lishuang Wang, et al., ACS Appl. Mater. Interfaces, 9, 38755-38760 (2017).
Xingliang Dai, et al., Solution-processed, high-performance light-emitting diodes based on quantum dots, 9 6, N a t u r e, vol. 515, Nov. 6, 2014, 15 pp.

ELECTROLUMINESCENT DEVICE, AND DISPLAY DEVICE COMPRISING THEREOF

CROSS-REFERENCE TO RELATED APPLICATION

This application is a continuation of U.S. patent application Ser. No. 17/079,319, filed Oct. 23, 2020, which in turn claims priority to Korean Patent Application No. 10-2019-0132890 filed in the Korean Intellectual Property Office on Oct. 24, 2019, and all benefits accruing therefrom under 35 U.S.C. §§ 119, 120, the contents of which in their entirety is incorporated herein by reference.

BACKGROUND

1. Field

An electroluminescent device and a display device comprising the electroluminescent device are disclosed.

2. Description of the Related Art

Quantum dots are nanocrystals of semiconductor materials with a diameter of several nanometers to several tens of nanometers, which exhibits a quantum confinement effect. Quantum dots generate stronger light in a narrow wavelength region than commonly used phosphors. Quantum dots emit light as excited electrons transition from a conduction band to a valence band. Moreover, the wavelength of emitted light depends upon particle size for a given compositional material, and quantum dots of relatively smaller particle size emit light of a shorter wavelength. Accordingly, quantum dots may provide light in a desirable wavelength region by adjusting the particle size.

A light emitting layer including quantum dots and various types of electronic devices that include the light emitting layer may save production costs, compared with an organic light emitting diode using a light emitting layer that includes a phosphorescent and/or fluorescent material. Moreover, desirable colors may be emitted by adjusting the particle size of quantum dots, without a need for using other organic light emitting materials in the light emitting layer.

Luminous efficiency of the light emitting layer including quantum dots is determined by the quantum efficiency of quantum dots, a balance of charge carriers, light extraction efficiency, and the like. Particularly, in order to improve the quantum efficiency, it may be advantageous to form and confine excitons to the light emitting layer, and when the excitons are not confined to the light emitting layer for a variety of different reasons or factors, the luminous efficiency will likely decrease due to exciton quenching.

SUMMARY

An embodiment provides an electroluminescent device having improved luminous efficiency and a display device including the electroluminescent device.

According to an embodiment, an electroluminescent device includes a first electrode and a second electrode each having a surface opposite the other; a light emitting layer disposed between the first electrode and the second electrode, the light emitting layer including quantum dots; and an electron transport layer disposed between the light emitting layer and the second electrode, the electron transport layer including inorganic material nanoparticles including an anion dopant including P, N, C, Cl, F, Br, S, or a combination thereof.

The anion dopant may be included in an amount of greater than 0 weight percent (wt %) and less than or equal to about 50 wt % based on 100 wt % of the inorganic material nanoparticles.

The anion dopant may be included in an amount of 0 wt % and less than or equal to about 10 wt % based on 100 wt % of the inorganic material nanoparticles.

The anion dopant may be included in an amount of about 10 wt % to about 50 wt % based on 100 wt % of the inorganic material nanoparticles.

The inorganic material nanoparticles may include a core and a shell surrounding at least a portion of the core, wherein the shell may include P, N, C, Cl, F, Br, S, or a combination thereof.

The core may include zinc oxide, and the shell may include $Zn_3P_2$, $Zn_3[(PO)_4]_2$, $ZnHPO_3$, $Zn_3N_2$, $ZnS$, $ZnSO_4$, $ZnCl_2$, $ZnBr_2$, $ZnF_2$, or a combination thereof.

The inorganic material nanoparticles that include a core of zinc oxide and the anion dopant may have a lowest unoccupied molecular orbital (LUMO) energy level that is higher than a similar zinc oxide core nanoparticles that do not include the anion dopant.

The inorganic material nanoparticles may include a ligand including a compound derived from carboxylic acid, a compound derived from thiol, or a combination thereof, attached to a surface of the inorganic material nanoparticles.

The electron transport layer may include at least two different layers with each layer including the inorganic material nanoparticles.

The electroluminescent device may further include a hole blocking layer disposed between the first electrode and the light emitting layer.

The LUMO energy level of the hole blocking layer may be higher than the LUMO energy level of a hole transport layer.

The hole blocking layer may include an inorganic oxide nanoparticle, a quinolone compound, a triazine-based compound, a quinoline-based compound, a triazole-based compound, a naphthalene-based compound, or a combination thereof.

The quantum dots may have a core-shell structure, the core of the quantum dots may include a first semiconductor nanocrystal, and the shell of the quantum dots may include a second semiconductor nanocrystal having a composition different from that of the first semiconductor nanocrystal.

The first semiconductor nanocrystal and the second semiconductor nanocrystal may independently include a Group II-VI compound that does not include cadmium, a Group III-V compound, a Group IV-VI compound, a Group IV element or compound, a Group I-III-VI compound, a Group I-II-IV-VI compound that does not include cadmium, or a combination thereof.

The quantum dots may emit light of a first wavelength region of about 380 nanometers (nm) to about 489 nm, a second wavelength region of about 490 nm to about 510 nm, a third wavelength region of about 511 nm to about 581 nm, a fourth wavelength region of about 582 nm to about 610 nm, or a fifth wavelength region of about 611 nm to about 680 nm.

The inorganic material nanoparticles may include a ligand including a compound derived from metal halide, a compound derived from carboxylic acid, a compound derived from thiol, or a combination thereof, attached to a surface of the quantum dots.

A functional layer may be further disposed between the first electrode and the second electrode, wherein the functional layer includes a hole transport layer, a hole injection layer, an electron blocking layer, an electron injection layer, or a combination thereof.

The hole transport layer may include a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine, N,N'-diphenyl-N,N'-bis(3-methylphenyl)-(1,1'-biphenyl)-4,4'-diamine, N,N'-di(naphthalen-1-yl)-N—N'-diphenyl-benzidine, tris(3-methylphenylphenylamino)-triphenylamine, dipyrazino[2,3-f:2',3'-h]quinoxaline-2,3,6,7,10,11-hexacarbonitrile (HAT-CN), poly(N,N'-diphenyl-N,N'-bis(3-methylphenyl)-(1,1'-biphenyl)-4,4'-diamine), NiO, $MoO_3$, or a combination thereof.

According to another embodiment, a display device including the electroluminescent device is provided.

An electroluminescent device having improved luminous efficiency and a display device including the electroluminescent device are provided.

DETAILED DESCRIPTION

Figure 1:
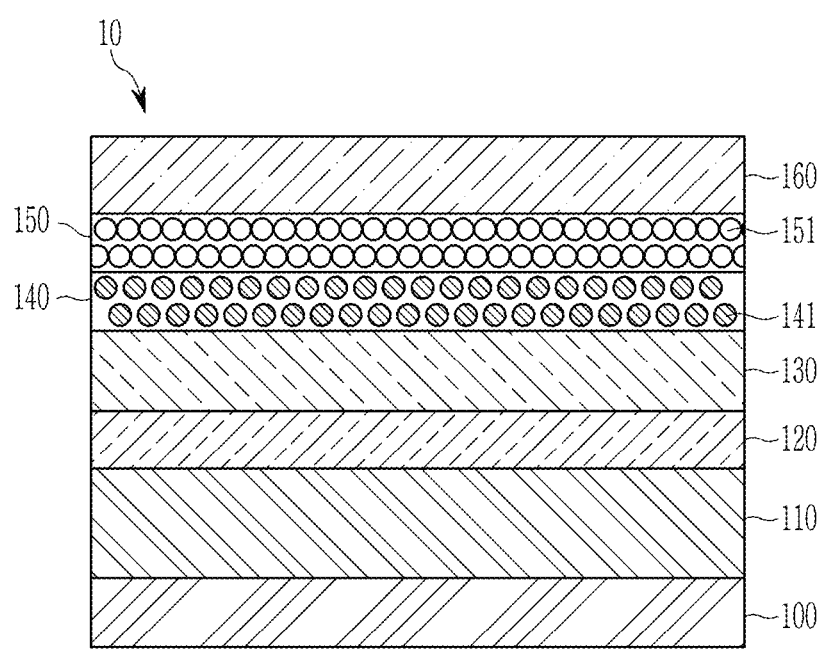
FIG. 1 is a schematic cross-sectional view showing an electroluminescent device according to an embodiment.

Example embodiments of the present disclosure will hereinafter be described in detail, and may be easily performed by a person having an ordinary skill in the related art. However, this disclosure may be embodied in many different forms, and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, when a definition is not otherwise provided, "thickness" refers to "an average thickness." The "average thickness" means an arithmetic mean value of thicknesses of measurement objects (e.g., layers, etc.) obtained from scanning electron microscope images at random from several times to several tens of times.

As used herein, for an average diameter of a particle in the present disclosure, although the average diameter of a particle may be determined by a measurement of an average size of a group, the generally used method includes a mode diameter showing the maximum value of the distribution, a median diameter corresponding to the center value of integral distribution curve, a variety of average diameters (numeral average, length average, area average, mass average, volume average, etc.), and the like. As used herein, unless particularly mentioned otherwise, an average particle diameter refers to a numeral average diameter in the present disclosure, and it is obtained by measuring D50 (particle diameter at a position of distribution rate of 50%).

As used herein, "Group" refers to a group of Periodic Table.

As used herein, "Group II" refers to Group IIA and Group IIB, and examples of Group II metal may be Cd, Zn, Hg, and Mg, but are not limited thereto.

As used herein, examples of "Group II metal that does not include Cd" refers to a Group II metal except Cd, for example Zn, Hg, Mg, etc.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

An electroluminescent device including quantum dots (hereinafter, referred to as a quantum dot electroluminescent device) are attracting attention as a next generation display device due to high color reproducibility of quantum dots and ease of solution processing.

The electron transport layer of the quantum dot electroluminescent device may in some instances include zinc oxide (ZnO) nanoparticles. The zinc oxide nanoparticles may be easily formed using a solution process at a low temperature, and thus the processability is relatively easy, and improved electron mobility is observed.

Recently, development of a cadmium-free, environmentally-friendly quantum dot has resulted in a trend of replacing conventional cadmium-based quantum dot and the like with the environmentally-friendly quantum dot material. However, since this environmentally-friendly quantum dot has a relatively low LUMO (lowest unoccupied molecular orbital) energy level compared with that of the conventional cadmium-based quantum dot, Applicant describes herein a way in which the energy balance in a quantum dot electroluminescent device can be better controlled or adjusted.

For example, conventional (or non-doped) zinc oxide nanoparticles may have excellent compatibility with the conventional cadmium-based quantum dot, but have relatively low compatibility with the environmentally-friendly quantum dot, for example, an environmentally-friendly blue quantum dot (e.g., a ZnSe-based quantum dot). Specifically, since the environmentally-friendly blue quantum dot has a relatively large LUMO energy level difference from that of the conventional zinc oxide nanoparticle, the environmentally-friendly blue quantum dot and the conventional zinc oxide nanoparticle may have relatively low compatibility.

Accordingly, in order to readjust an energy balance of the quantum dot electroluminescent device, and thereby improve upon the compatibility with the environmentally-friendly quantum dot, a method of filling or treating the surface of a zinc oxide with an organic organic/inorganic material and the like, or introducing a metal cation-based dopant (e.g., magnesium, cobalt, zirconium, manganese, nickel, yttrium, aluminum, cesium, and the like) into a zinc site (a Zn site) of the zinc oxide has been suggested. However, even though the energy balance of the zinc oxide is treated as such above, internal characteristics of the zinc oxide and its characteristic change of the surface remain difficult to freely adjust or control. For example, the LUMO energy level of the zinc oxide into which the metal cation dopant is introduced is likely to decrease compared with a pure zinc oxide.

To find a better solution to the adjustment of energy balance in the zinc oxide nanoparticles, the present inventors researched a method of improving the energy balance of a zinc oxide-based electron transport layer in the quantum dot electroluminescent device. The inventors discovered that when the zinc oxide having a predetermined anion dopant is introduced into an oxygen site (an O site) of a zinc oxide nanoparticles that are included in an electron transport layer of a quantum dot electroluminescent device, excellent luminous efficiency of the quantum dot electroluminescent device could be realized by achieving a stable energy balance and improved energy level, and therefore, resulting in the invention claimed and described herein.

Thus, referring to FIG. 1, a cross-sectional schematic representation of an electroluminescent device according to an embodiment is described. An electroluminescent device 10 according to an embodiment includes a first electrode 110 and a second electrode 160 each having a surface opposite the other, a hole transport layer 130 disposed between the first electrode 110 and the second electrode 160, a hole injection layer 120 that is disposed between the first electrode 110 and the hole transport layer 130 and is optionally omitted in consideration of the relationship with each constituent element, a light emitting layer 140 disposed between the hole transport layer 130 and the second electrode 160, and an electron transport layer 150 disposed between the light emitting layer 140 and the second electrode 160. In an embodiment, the electron transport layer 150 includes inorganic material nanoparticles with a predetermined anion dopant. Accordingly, the electroluminescent device 10 has a stacked structure in which the light emitting layer 140, the electron transport layer 150, and other functional layers (e.g., hole injection layer 120 and hole transport layer 130) are disposed between the first electrode 110 and the second electrode 160 each having a surface opposite the other, as shown in FIG. 1.

In an embodiment, the first electrode 110 may be directly connected to a driving power source, and thus, providing current flow to the light emitting layer 140. The first electrode 110 may include a material having light transmittance in at least visible light wavelength region, but is not necessarily limited thereto. The first electrode 110 may include a material having light transmittance in an infrared or ultraviolet (UV) wavelength region. For example, the first electrode 110 may be an optically transparent material.

In an embodiment, the first electrode 110 may include molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof. However, the first electrode 110 according to an embodiment is not necessarily limited thereto, but may include a material further having light transmittance with respect to light in an infrared or ultraviolet (UV) wavelength region or a semi-permeable material selectively transmitting light in a particular wavelength region, and thus, provide for the reflection of light in a visible light wavelength region back toward the second electrode 160.

Meanwhile, in an embodiment, the first electrode 110 may be disposed on the substrate 100 as shown in FIG. 1. The substrate 100 may be a transparent insulating substrate or may be made of a ductile material such as a plastic. The substrate 100 may include glass or a polymer material in a film having a glass transition temperature (Tg) of greater than about 150° C. For example, it includes a COC (cycloolefin copolymer) or COP (cycloolefin polymer) based material.

In an embodiment, the substrate 100 may support the hole injection layer 120, the transport layer 130, the light emitting layer 140, and the electron transport layer 150 disposed between the first electrode 110 and the second electrode 160. Alternatively, a substrate (not shown) may be disposed on the second electrode 160 or may be omitted, as needed.

The second electrode 160 includes an optically transparent material and may function as a light-transparent electrode so as to transmit light generated in the light emitting layer 140 out of the device. In an embodiment, the second electrode 160 may include at least one selected from silver (Ag), aluminum (Al), copper (Cu), gold (Au), and an alloy thereof, molybdenum oxide, tungsten oxide, vanadium oxide, rhenium oxide, niobium oxide, tantalum oxide, titanium oxide, zinc oxide, nickel oxide, copper oxide, cobalt oxide, manganese oxide, chromium oxide, indium oxide, or a combination thereof. However, the second electrode 160 according to an embodiment is not necessarily limited thereto but may include a semi-permeable material selectively transmitting light in a particular wavelength region, and/or a function to reflect light in a visible light wavelength region back toward the first electrode 110.

When the second electrode 160 functions as a reflecting electrode, the first electrode 110 may be a light-transmitting electrode formed of a material transmitting light in at least visible light wavelength region or a semi-permeable electrode selectively transmitting light in a particular wavelength region.

Each of the first electrode 110 and the second electrode 160 may be formed by depositing a material for forming an electrode on the substrate 100 or an organic layer by a method such as sputtering.

The electroluminescent device 10 according to an embodiment of FIG. 1 is not necessarily limited thereto but may have various structures within a range of satisfying the aforementioned order of disposing each constituent element. For example, when the substrate 100 is disposed not beneath the first electrode 110 but on the second electrode 160, the electroluminescent device 10 may have an inverted structure.

The hole injection layer 120 may be disposed between the first electrode 110 and the second electrode 160, for example between the first electrode 110 and the hole transport layer 130 described later, for example disposed directly on the first electrode 110. The hole injection layer 120 may supply holes into the light emitting layer 140 together with the hole transport layer 130. However, the hole injection layer 120 may be omitted considering the thickness and the material of the hole transport layer 130.

The hole injection layer 120 may be formed of a p-type semiconductor material or a material doped with a p-type semiconductor. For example, the hole injection layer 120 may include poly(3,4-ethylenedioxythiophene) [PEDOT] or a derivative thereof, poly(styrenesulfonate) [PSS] or a derivative thereof, poly-N-vinylcarbazole (PVK) or a derivative thereof, polyphenylenevinylene or a derivative thereof, poly p-phenylene vinylene (PPV) or a derivative thereof, polymethacrylate or a derivative thereof, poly(9,9-dioctylfluorene) or a derivative thereof, poly(spiro-bifluorene) or a derivative thereof, tris(4-carbazol-9-yl phenyl) amine (TCTA), N,N'-diphenyl-N,N'-bis(3-methylphenyl)-(1,1'-biphenyl)-4,4'-diamine (TPD), N,N'-di(naphthalen-1-yl)-N—N'-diphenyl-benzidine (NPB), tris(3-methyldiphenylamino)-triphenylamine (m-MTDATA), dipyrazino[2,3-f:2', 3'-h]quinoxaline-2,3,6,7,10,11-hexacarbonitrile (HAT-CN), poly(N,N'-diphenyl-N,N'-bis(3-methylphenyl)-(1,1'-biphenyl)-4,4'-diamine) (poly-TPD), a metal oxide such as NiO and $MoO_3$, or a combination thereof, but is not necessarily limited thereto.

The hole transport layer 130 may be disposed between the first electrode 110 and the second electrode 160, for example on the first electrode 110, or on the hole injection layer 120 as shown. The hole transport layer 130 may provide and transport holes to the light emitting layer 140. The hole transport layer 130 may be formed directly on the light emitting layer 140.

In an embodiment, the hole transport layer 130 may include a material having hole transporting property. The material having the hole transporting property may be a p-type semiconductor or a material doped with a p-type semiconductor. The material having the hole transporting property is not limited to a specific material but may be a polymer, an oligomer, a metal oxide, or a combination thereof.

Examples of the material having the hole transporting property may include a poly(3,4-ethylenedioxythiophene) derivative, a poly(styrenesulfonate) derivative, a poly-N-vinylcarbazole derivative, a polyphenylenevinylene derivative, a poly(para-phenylene)vinylene derivative, a polymethacrylate derivative, a polyarylamine derivative, a polyaniline derivative, a polypyrrole derivative, a poly(9,9-dioctylfluorene) derivative, a poly(spiro-nonfluorene) derivative, tris(4-carbazoyl-9-ylphenyl)amine (TCTA), N,N'-diphenyl-N,N'-bis(3-methylphenyl)-(1,1'-biphenyl)-4,4'-diamine (TPD), N,N'-di(naphthalene-1-yl)-N—N'-diphenyl-benzidine (NPB), tris(3-methyldiphenylamino)-triphenylamine (m-MTDATA), dipyrazino[2,3-f:2', 3'-h]quinoxaline-2,3,6,7,10,11-hexacarbonitrile (HAT-CN), poly-TPD, NiO, $MoO_3$, or a combination thereof, but is not limited thereto.

In an embodiment, a thickness of the hole transport layer 130 may be varied in consideration of an energy balance with the hole injection layer 120, the hole transport layer 130, and/or the light emitting layer 140 in the device. The thickness of the hole transport layer 130 may be for example greater than or equal to about 10 nm, greater than or equal to about 15 nm, or greater than or equal to about 20 nm and for example less than or equal to about 80 nm, less than or equal to about 70 nm, less than or equal to about 60 nm, or less than or equal to about 50 nm, for example about 10 nm to about 80 nm, about 10 nm to about 70 nm, about 10 nm to about 60 nm, about 10 mm to about 50 nm, about 10 nm to about 40 nm, or about 20 nm to about 40 nm.

For example, the hole transport layer 130 may be formed by a wet coating method such as spin coating and the like. For example, both of the hole transport layer 130 and light emitting layer 140, and specifically both of hole transport layer 130 and the light emitting layer 140 may be formed by a wet coating method. In this way, the hole transport layer 130 and/or the light emitting layer 140 may be formed in a simple process.

In addition, in an embodiment, the hole transport layer 130 and the light emitting layer 140 may be made of materials having relatively different solubilities. For example, the hole transport layer 130 may be prepared using a material having excellent solubility in an aromatic non-polar solvent, while the light emitting layer 140 may be prepared using a material having excellent solubility in an aliphatic non-polar solvent. Accordingly, even though the hole transport layer 130 and the light emitting layer 140 are directly in contact with another by using the solution process, the light emitting layer 140 may be formed without surface damage of the hole transport layer 130 due to the different solubility of the hole transport layer 130 and the light emitting layer 140.

For example, when a poly[(9,9-dioctylfluorene-2,7-diyl)-co-(4,4'-(N-4-butylphenyl)diphenylamine)] (TFB) polymer film is formed as the hole transport layer 130, a precursor solution including a TFB precursor polymer and an aromatic non-polar solvent (e.g., toluene, xylene, etc.) is spin-coated on the first electrode 110 or the hole injection layer 120, thermal treatment is performed in an inert gas atmosphere of $N_2$ or in a vacuum at a temperature of about 150° C. to about 1800° C. for about 30 minutes to form a hole transport layer 130 made of TFB, and the light emitting layer 140 may be easily formed thereon using an aliphatic non-polar solvent (for example, octane, nonane, cyclohexane, etc.) using a solution process.

As such, when the hole transport layer 130 and the light emitting layer 140 is configured to have different relative solubility, the formation of the hole transport layer 130 and the light emitting layer 140 using a solution process is more easily performed, and the surface damage of the hole transport layer 130 by organic solvents may be minimized during the formation of the light emitting layer 140.

The light emitting layer 140 may be disposed between the hole transport layer 130 and the second electrode 160, for example on the hole transport layer 130, for example directly on the hole transport layer 130 and may include quantum dots.

The light emitting layer 140 is a site where holes and electrons formed as a result of a current being applied between the first electrode 110 and the second electrode 160 combine to generate excitons. The generated excitons then transition or relax from an exited state to a ground state and emit light of a wavelength corresponding to the particle size of the quantum dots. That is, the quantum dots provide the light emitting layer 140 with an electro-luminescence property. Particularly, the quantum dots have a discontinuous energy bandgap by the quantum confinement effect and incident light is converted into light having a particular wavelength. Accordingly, the light emitting layer 140 including the quantum dots may produce light having excellent color reproducibility and color purity.

In an embodiment, the light emitting layer 140 may emit light in a predetermined wavelength region by the quantum dots. In an embodiment, the predetermined wavelength region may be a wavelength region belonging to a ultraviolet light region and/or a visible light region, for example a wavelength region belonging to a visible light region, for example, a first wavelength region of about 380 nm to about 489 nm, a second wavelength region of about 490 nm to about 510 nm, a third wavelength region of about 511 nm to about 581 nm, a fourth wavelength region of about 582 nm to about 610 nm, or a fifth wavelength region of about 620 nm to about 680 nm.

In an embodiment, the quantum dots 141 may emit blue light belonging to a first wavelength region of about 380 nm to about 489 nm. In this case, the light emitting layer 140 may be a blue light emitting layer.

Alternatively, the quantum dots 141 may emit green light belonging to a third wavelength region of about 511 nm to about 581 nm. In this case, the light emitting layer 140 may be a green light emitting layer.

Alternatively, the quantum dots 141 may emit red light belonging to a fifth wavelength region of about 620 nm to about 680 nm. In this case, the light emitting layer 140 may be a red light emitting layer.

In an embodiment, materials of the quantum dots 141 are not particularly limited and known or commercially available quantum dots may be used.

In an embodiment, the quantum dots 141 may have a core-shell structure.

In an embodiment, the quantum dots 141 may include a quantum dot core that includes a first semiconductor nanocrystal, and the quantum dot shell may include a second semiconductor nanocrystal having a composition different from that of the first semiconductor nanocrystal.

In an embodiment, the interface between the quantum dot core and the quantum dot shell may have a concentration gradient where a concentration of element(s) in the shell decreases toward the center of the quantum dot. In an embodiment, the quantum dots may have a structure (core-single shell structure) including one quantum dot core and one layer of quantum dot shell surrounding it. In this case, the single shell structure may have a single composition or concentration gradient.

Alternatively, the quantum dots 141 may have a structure (core multi-shell structure) including a quantum dot core and a multi-layered shell surrounding the core. Herein, the multi-layered shell structure has a quantum dot shell structure of two or more shells and each layer may have a single composition or an alloy or may have a concentration gradient. As such, when each of the quantum dots 141 has a core-shell structure (e.g., a core-single shell structure and/or a core multi-layered shell structure), a material composition constituting the quantum dot shell may have a larger bandgap energy than that of the quantum dot core and even in the case of a multi-layered shell, a quantum dot shell as an outer shell layer may have a structure having a larger bandgap energy than a quantum dot shell of an inner shell layer, i.e., a shell closer to the core. As a result, a more effective quantum confinement may be obtained by using a quantum dot having a core-shell structure or a core multi-shell structure as described above.

In an embodiment, the first semiconductor nanocrystal included in the quantum dot core and the second semiconductor nanocrystal included in the quantum dot shell may independently include a Group II-VI compound that does not include cadmium, a Group III-V compound, a Group IV-VI compound, a Group IV element or compound, a Group I-III-VI compound, a Group I-II-IV-VI compound that does not include cadmium, or a combination thereof. That is, the quantum dots 141 according to an embodiment may be a cadmium-free quantum dot. When the quantum dots 141 consist of cadmium-free materials, the cadmium-free materials have no environmental toxicity concerns compared with a conventional cadmium-based quantum dots, and thus, are safer for the consumer and environmentally-friendly.

The Group II-VI compound may be selected from a binary element compound selected from ZnS, ZnSe, ZnTe, ZnO, HgS, HgSe, HgTe, MgSe, MgS, and a mixture thereof; a ternary element compound selected from ZnSeS, ZnTeSe, ZnTeS, HgSeS, HgTeSe, HgTeS, HgZnS, HgZnSe, HgZnTe, MgZnSe, MgZnS, and a mixture thereof; and a quaternary element compound selected from HgZnTeS, HgZnSeS, HgZnTeSe, and a mixture thereof. The Group II-VI compound may further include a Group III metal.

The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, InZnP, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal (InZnP).

The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group I-III-VI compound may be CuInSe$_2$, CuInS$_2$, CuInGaSe, and CuInGaS, are not limited thereto.

Examples of the Group I-II-IV-VI compound may be CuZnSnSe and CuZnSnS, are not limited thereto. Examples of the Group IV compound may be a single substance selected from Si, Ge, and a mixture thereof; and a binary element compound selected from SiC, SiGe, and a mixture thereof.

The binary element compound, the ternary element compound, or the quaternary element compound respectively exists in a uniform concentration in the particle or in partially different concentrations in the same particle.

The quantum dots 141 may have quantum efficiency of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 90%, or even approach 100%.

In a display, the quantum dots 141 may have a relatively narrow emission wavelength spectrum so as to improve color purity or color reproducibility. The quantum dots 141 may have for example a full width at half maximum (FWHM) of an emission wavelength spectrum of less than or equal to about 45 nm, less than or equal to about 40 nm, less than or equal to about 35 nm, or less than or equal to or about 30 nm. Within the ranges, color purity or color reproducibility of a device may be improved.

The quantum dots 141 may have an average particle diameter (the longest size for a non-spherically shaped particle) of about 1 nm to about 100 nm. For example, the quantum dots 141 may have an average particle diameter (the longest size for a non-spherically shaped particle) of about 1 nm to about 20 nm, about 1 nm to about 15 nm, about 1 nm to about 14 nm, about 1 nm to about 13 nm, about 1 nm to about 12 nm, about 1 nm to about 11 nm, or about 1 nm to about 10 nm.

In addition, the shapes of the quantum dots 141 may be general shapes in this art and thus may not be particularly limited. For example, the quantum dots 141 may have a spherical, oval, tetrahedral, pyramidal, cuboctahedral, cylindrical, polyhedral, multi-armed, or cube nanoparticle, nanotube, nanowire, nanofiber, nanosheet, or a combination thereof. The quantum dots may have any cross-sectional shape.

The quantum dots 141 may be commercially available or may be synthesized accordance to known methods. For example, several nanometer-sized quantum dots may be synthesized according to a wet chemical process. In the wet chemical process, precursors react in an organic solvent to grow crystal particles, and the organic solvent or surfactants for forming ligands may coordinate the surface of the quantum dot, controlling the growth of the crystal. Examples of the organic solvent and the surfactants for forming ligands are known.

The organic solvent and the surfactants for forming ligands may be selected appropriately. Examples of the organic solvent may include C6 to C22 primary amine such as hexadecylamine; C6 to C22 secondary amine such as dioctylamine; C6 to C40 tertiary amine such as trioctylamine; nitrogen-containing heterocyclic compounds such as pyridine; C6 to C40 olefin such as octadecene; C6 to C40 aliphatic hydrocarbon such as hexane, octane, hexadecane, octadecane, or squalane; aromatic hydrocarbon substituted with a C6 to C30 alkyl group such as phenyldodecane, phenyltetradecane, or phenyl hexadecane; primary, secondary, or tertiary phosphine (e.g., trioctylphosphine) substituted with at least one (e.g., 1, 2, or 3) C6 to C22 alkyl group; phosphine oxide (e.g. trioctylphosphine oxide) substituted with at least one (e.g., 1, 2, or 3) C6 to C22 alkyl group; C12 to C22 aromatic ether such as phenyl ether, benzyl ether; or a combination thereof.

Examples of the surfactants for forming ligands may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, RHPOOH, R$_2$POOH (wherein, R and R' are independently hydrogen, a C1 to C40 substituted or unsubstituted aliphatic hydrocarbon, or C6 to C40 substituted or unsubstituted aromatic hydrocarbon, or a combination thereof, and in each ligand, at least one R is not hydrogen), or a combination thereof, but are not limited thereto.

Since organic solvents coordinated to the surfaces of the quantum dots may affect stability in the device, excess materials (organic solvents, surfactants for forming ligands, or combinations thereof) that are not coordinated to the surface of the nanocrystals may be removed by excessively pouring them into a non-solvent and centrifuging the resultant mixture. Specific examples of the non-solvent include, but are not limited to, acetone, ethanol, and methanol. After removing excess material, the amount of materials coordinated to the surfaces of the quantum dots may be less than or equal to about 50 wt %, for example, less than or equal to about 30 wt %, less than or equal to about 20 wt %, or less than or equal to about 10 wt % based on the total weight of the quantum dots. The materials coordinated to the surfaces of the quantum dots may include ligands, organic solvents, or a combination thereof. The materials coordinated to the surfaces of the quantum dots, specifically the ligands, may impart dispersibility to the quantum dots.

In an embodiment, ligands attach to the surfaces of the quantum dots 141. In an embodiment, examples of the ligand may be a compound derived from a metal halide, a compound derived from a carboxylic acid, a compound derived from thiol, or a combination thereof.

The ligand may be chemically bound to the surface of the quantum dot, or the ligand may be bound by electrostatic attraction, that is, a dispersing force (van der Waals bond) may be applied to the surface of the quantum dot, or both types of binding may be present. In an embodiment, the dispersing force may be between the ligand and the surface of the quantum dots. For example, when the ligand is a hydrophobic ligand, the hydrophobic ligand may include a moiety to which a dispersing force with the surface of the attached quantum dot is applied, and a hydrophobic functional group that imparts hydrophobicity. In an embodiment, examples of the hydrophobic ligand may be a compound derived from a carboxylic acid, a compound derived from thiol, or a combination thereof.

Examples of the hydrophobic moiety may include a C4 to C20 alkyl group, a C4 to C20 alkenyl group, a C4 to C20 alkynyl group, or a combination thereof and examples of the moiety that forms a bond with the surface of the quantum dot may be a carboxylate (—COO—) moiety, a thiolate (—SH—) moiety, and the like.

In an embodiment, examples of the compound derived from carboxylic acids may include a compound derived from fatty acid such as oleate, stearate, palmitate, and the like. In an embodiment, examples of the compound derived from the thiol may include C6 to C20 aliphatic thiolate. For example, when the quantum dots 141 have hydrophobic ligands as described above, the light emitting layer 140 including the same may also exhibit non-polarity as a whole. In addition, the first quantum dots to which the hydrophobic ligands are attached have solvent selectivity with respect to a non-polar solvent, specifically an aliphatic non-polar solvent. Accordingly, even if the light emitting layer 140 is formed on the hole transport layer 130 having solvent selectivity for the aromatic non-polar solvent by using a solution process, damage to the surface of the hole transport layer 130 by an organic solvent during the formation of the light emitting layer 140 may be minimized. However, an embodiment is not necessarily limited thereto. The quantum dots 141 may not have the aforementioned hydrophobic ligands.

For example, at least one surface of the quantum dots 141 may have ligands having a lower solubility in an organic solvent than a quantum dot having the aforementioned hydrophobic ligand attached thereto. In this case, examples of the ligand may include a compound derived from a metal halide.

The metal halide may include zinc, indium, gallium, magnesium, lithium, or a combination thereof, and/or may be in a form of chloride, bromide, iodide, or fluoride. The metal included in the metal halide may be the same as the metal included in the outermost layer of the quantum dots, or may be different from each other.

Specific examples of metal halide may be zinc fluoride, zinc chloride, zinc bromide, zinc iodide, indium fluoride, indium chloride, indium bromide, indium iodide, gallium fluoride, gallium chloride, gallium bromide, gallium iodide, magnesium fluoride, magnesium chloride, magnesium bromide, magnesium iodide, lithium fluoride, a lithium chloride, lithium bromide, lithium iodide, or a combination thereof.

The compound derived from the metal halide may include a moiety that is chemically bound to the surface of the attached quantum dot. Examples of the moiety that forms a bond with the surface of the quantum dot may include a halogen ion moiety (e.g., $F^-$, $Cl^-$, $Br^-$, $I^-$). The halogen ion moiety may be strongly bound to the surface of the quantum dots and may passivate the quantum dots, and which can differentiate a quantum dot having other ligands (e.g., hydrophobic ligands such as oleic acid, etc.) on the surface of the quantum dots.

The compound derived from the metal halide may be obtained by reacting a metal halide solution on the light emitting layer including quantum dots to which an aforementioned hydrophobic ligand is attached. At least a portion of the hydrophobic ligands attached to the quantum dots may be replaced (or substituted) with the halogen ion moiety. A ratio of the hydrophobic ligand attached to the surface of the quantum dots and the compound derived from the metal halide may be variously controlled by adjusting a concentration of the metal halide solution, a reaction time, and the like.

While not wishing to be bound by any theory, the aforementioned hydrophobic ligand may reduce luminous efficiency of quantum dots because the hydrophobic moiety generally acts as a barrier against electron and hole injection. However, in an embodiment, the quantum dots attached to the compound derived from the metal halide may provide improved passivation as well as improved charge injection characteristics compared with the quantum dots attached with the hydrophobic ligand in the absence of the metal halide.

In an embodiment, a thickness of the light emitting layer 140 may be may vary depending on types and sizes of the quantum dots 141 and types of ligands attached thereto. However, it may be for example greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, greater than or equal to about 30 nm, or greater than or equal to about 35 nm.

The light emitting layer 140 may include two or more monolayers, for example, three or more layers, or four or more layers of quantum dots. The thickness of the light emitting layer 140 may be less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm. The thickness of the light emitting layer 140 may be for example about 10 nm to about 60 nm, about 15 nm to about 60 nm, about 20 nm to about 60 nm, about 25 nm to about 60 nm, or about 25 nm to about 50 nm.

The electroluminescent device 10 according to an embodiment may include the quantum dots in a predetermined amount in order to exhibit improved luminous efficiency of the light emitting layer 140. For example, a total amount of the quantum dots 141 may be greater than or equal to about 5 wt %, greater than or equal to about 10 wt %, greater than or equal to about 15 wt %, or greater than or equal to about 20 wt %, and less than or equal to about 98 wt %, less than or equal to about 95 wt %, less than or equal to about 90 wt %, less than or equal to about 85 wt %, less than or equal to about 80 wt %, less than or equal to about 75 wt %, less than or equal to about 70 wt %, less than or equal to about 65 wt %, less than or equal to about 60 wt %, less than or equal to about 55 wt %, or less than or equal to about 50 wt %, for example about 5 wt % to about 98 wt %, about 20 wt % to about 98 wt %, about 20 wt % to about 90 wt %, about 20 wt % to about 85 wt %, about 50 wt % to about 85 wt %, or about 50 wt % to about 80 wt %, based on 100 wt % of the light emitting layer.

However, an embodiment is not necessarily limited thereto, the total amount of the quantum dots 141 in the light emitting layer 140 may be varied depending on amounts of other constituent elements (e.g., a binder, a non-solvent, an organic solvent, etc.) included in the light emitting layer 140, types and/or amounts of the used ligands, materials constituting the quantum dots 141, core-shell structures of the quantum dot 141, the number of the quantum dot shell and/or quantum dot shell thickness, wavelength ranges of the emitted light, thicknesses of the hole transport layer 130, the light emitting layer 140, and/or the electron transport layer 150.

In an embodiment, the electron transport layer 150 may be disposed between the light emitting layer 140 and the second electrode 160, for example, directly on the light emitting layer 140, and serves to transport electrons to the light emitting layer 140.

In an embodiment, a thickness of the electron transport layer 150 may be varied considering energy balance of the hole injection layer 120, the hole transport layer 130, and/or the light emitting layer 140 in the device, but may be, for example, greater than or equal to about 10 nm, greater than or equal to about 15 nm, or greater than or equal to about 20 nm, and for example less than or equal to about 100 nm, less than or equal to about 90 nm, less than or equal to about 80 nm, less than or equal to about 70 nm, less than or equal to about 60 nm, less than or equal to about 50 nm, or less than or equal to about 40 nm, for example about 10 nm to about 100 nm, about 10 nm to about 60 nm, about 10 nm to about 50 nm, about 10 mm to about 40 nm, or about 15 nm to about 40 nm.

When the electron transport layer 150 has a thickness outside of the above stated ranges, voids, cracks, and the like of the electron transport layer 150 may form, which may have a significant effect on electron transport properties and lead to a decrease in device characteristics or performance. Moreover, it may be difficult to achieve an energy balance with other constituent elements of the electroluminescent device 10.

In an embodiment, the electron transport layer 150 may consist of non-light-emitting electron transporting materials that do not emit light by an electric field so that electrons may not be quenched internally.

In an embodiment, the electron transport layer 150 may include inorganic nanoparticles 151 into which a predetermined anionic dopant is introduced, as described above and throughout.

Figure 2:
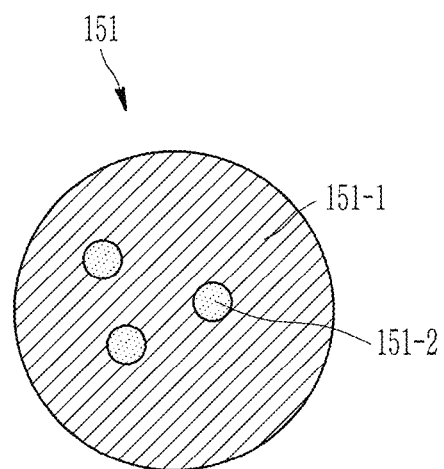
FIGS. 2 and 3 are schematic views showing an inorganic material nanoparticles of FIG. 1.

In an embodiment, the electron transport layer 150 may include at least two inorganic material nanoparticles 151. In an embodiment, the electron transport layer 150 may include at least two different layers with each layer including the inorganic material nanoparticles 151. For example, the inorganic material nanoparticles 151 may represent a structure in which an undoped first portion 151-1 and a second portion 151-2 doped with the anion dopant are mixed as shown in FIG. 2.

Examples of the inorganic material nanoparticles 151 may be a salt of a metal including zinc (Zn), magnesium (Mg), tin (Sn) zirconium (Zr), titanium (Ti), aluminum (Al), tantalum (Ta), tungsten (W), or a combination thereof. In an embodiment, examples of the inorganic material nanoparticles may be an oxide of a metal including zinc (Zn), magnesium (Mg), tin (Sn) zirconium (Zr), titanium (Ti), aluminum (Al), tantalum (Ta), tungsten (W), or a combination thereof.

In an embodiment, examples of the anion dopant to be introduced into the inorganic material nanoparticles 151 may include P, N, C, Cl, F, Br, S, or a combination thereof. Specifically, P, N, Cl, F, Br, S, or a combination may be used as the anion dopant.

In an embodiment, the anion dopant may be included in an amount of greater than 0 wt % and less than or equal to about 50 wt % based on 100 wt % of the inorganic material nanoparticles 151.

In an embodiment, the inorganic material nanoparticles 151 may have different microstructures depending on an amount of the anion dopant in the electron transport layer 150.

Figure 3:
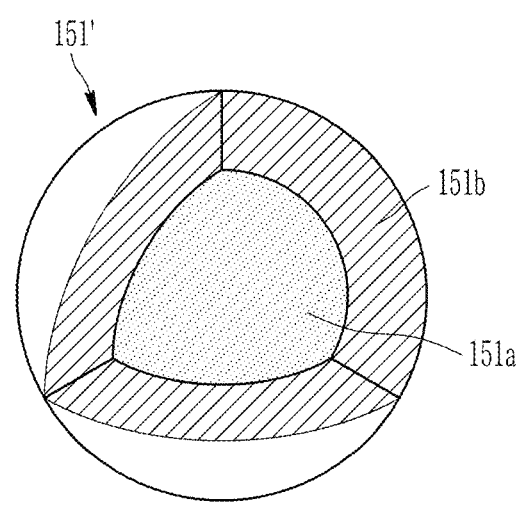

FIGS. 2 to 3 are schematic views showing various examples of inorganic material nanoparticles represented in FIG. 1.

For example, an anion dopant may be included in an amount of 0 wt % and less than or equal to about 10 wt % based on 100 wt % of the inorganic material nanoparticles 151. In this case, the inorganic material nanoparticles 151 may represent a structure in which an undoped first portion 151-1 and a second portion 151-2 doped with the anion dopant are mixed as shown in FIG. 2.

In another exemplary embodiment, the anion dopant may be included in an amount of about 10 wt % to about 50 wt %, for example about 10 wt % to about 45 wt %, about 10 wt % to about 40 wt %, or about 10 wt % to about 35, based on 100 wt % of the inorganic material nanoparticles 151'. In this case, the inorganic material nanoparticles 151' may have a core-shell structure including a core 151a and a shell 151b surrounding at least a portion of the core 151, as shown in FIG. 3.

In an embodiment, at least one of the core 151a and the shell 151b may include an element and/or atomic group derived from the anionic dopant described above, for example P, N, C, Cl, F, Br, S, or a combination thereof.

In an embodiment, the core 151a may include a metal oxide. Examples of the metal oxide may include zinc oxide, magnesium oxide, tin oxide, zirconium oxide, titanium oxide, aluminum oxide, tantalum oxide, tungsten oxide, or a combination thereof. In an embodiment, the core 151a may include zinc oxide.

The metal oxide may be doped with the aforementioned anion dopant. For example, the core 151a may be zinc oxide doped with the anion dopant including P, N, C, Cl, F, Br, S, or a combination thereof.

In an embodiment, the shell 151b may include P, N, C, Cl, F, Br, S, or a combination thereof. That is, while the amount of the anionic dopant in the electron transport layer 150 exceeds the aforementioned critical amount (for example, 10 wt %), the shell 151b derived from the aforementioned anionic dopant may be formed on the surface of the core 151a.

In an embodiment, the shell 151b may include a material in which an element and/or atomic group derived from the anionic dopant and a metal derived from the metal oxide that is a main component of the core 151a are chemically bound to each other. Examples thereof may be $Zn_3P_2$, $Zn_3[(PO)_4]_2$, $ZnHPO_3$, $Zn_3N_2$, $ZnS$, $ZnSO_4$, $ZnCl_2$, $ZnBr_2$, $ZnF_2$, or a combination thereof, but is not necessarily limited thereto.

In an embodiment, the inorganic nanoparticles 151 and 151' have higher LUMO energy levels than conventional zinc oxide nanoparticles (not including the anionic dopant, i.e. undoped zinc oxide).

In a particular embodiment, the material constituting the shell 151b, specifically, the material in which the metal derived from the metal oxide that is the main component of the core 151a is chemically bound to each other, may have a higher LUMO energy level than the conventional metal oxide constituting the core 151a.

Accordingly, the inorganic nanoparticles 151 and 151' according to the embodiment may lower an energy barrier between the electron transport layer 150 and the light emitting layer 140 compared with the zinc oxide nanoparticles that are not doped with the anionic dopant. Therefore, when the inorganic nanoparticles 151 and 151' described above are used as electron transport materials, the electroluminescent device 10 having improved electron transport properties may be achieved.

According to an embodiment, predetermined ligands may be attached to the surfaces of the inorganic nanoparticles 151. Specific types and chemical properties (e.g., hydrophilicity, hydrophobicity, polarity, non-polarity, etc.) of the ligands may be selected with consideration of chemical properties of the anionic dopant, the order of formation of the electron transport layer 150 and the light emitting layer 140, and the like.

For example, when the anion dopant is hydrophobic, a hydrophobic ligand may be selected and attached to a surface of the inorganic material nanoparticles 151 for smooth doping of the anion dopant. Alternatively, when the electron transport layer 150 is formed on the light emitting layer 140 including the quantum dot 141 having a hydrophobic ligand and thus being overall hydrophobic, a hydrophilic ligand maybe selected and attached to a surface of the inorganic material nanoparticles 151 in order to minimize damage of the light emitting layer 140.

A type of a ligand attached to the inorganic material nanoparticles 151 is not particularly limited but may be formed by using publicly-known various surfactants for forming a ligand. Examples of the surfactants for forming a ligand may be the same as the surfactant for forming a ligand, which is used for the quantum dot 141.

Specifically, examples of the ligand attached to the inorganic material nanoparticles 151 may include a compound derived from carboxylic acid, a compound derived from thiol, or a combination thereof.

In an embodiment, examples of the compound derived from carboxylic acid may include a compound derived from fatty acid such as oleate, stearate, palmitate, and the like. In an embodiment, examples of the compound derived from thiol may include C6 to C20 aliphatic thiolate substituted or unsubstituted with a hydroxy group (—OH), a carboxyl group (—COOH), and the like.

In an embodiment, the electroluminescent device may include various functional layers disposed between the first electrode 110 and the second electrode 160, for example, an electron injection layer facilitating an electron injection and/or a hole blocking layer blocking a hole movement in addition to the hole injection layer 120 or the hole transport layer 130. The functional layers may be used respectively as a single or a combination of two layers or more.

The electron injection layer and the hole blocking layer may have each desirably selected thickness. For example, each thickness may be in a range of greater than or equal to about 1 nm and less than or equal to about 500 nm but is not limited thereto. The electron injection layer and/or hole blocking layer may be formed by vapor deposition or through a solution process.

Each of the electron injection layer and/or the hole blocking layer may include an inorganic oxide nanoparticle, a quinolone compound, a triazine compound, a quinoline compound, a triazole compound, a naphthalene compound, or a combination thereof. The electron injection layer and/or the hole blocking layer may include for example at least one selected from 1,4,5,8-naphthalene-tetracarboxylic dianhydride (NTCDA), bathocuproine (BCP), tris[3-(3-pyridyl)-mesityl]borane (3 TPYMB), LiF, Alq$_3$, Gaq$_3$, Inq$_3$, Znq$_2$, Zn(BTZ)$_2$, BeBq$_2$, Liq, n-type metal oxide (e.g., ZnO, ZnMgO, HfO$_2$, etc.), Bphen, and a combination thereof, but is not limited thereto.

Figure 4:
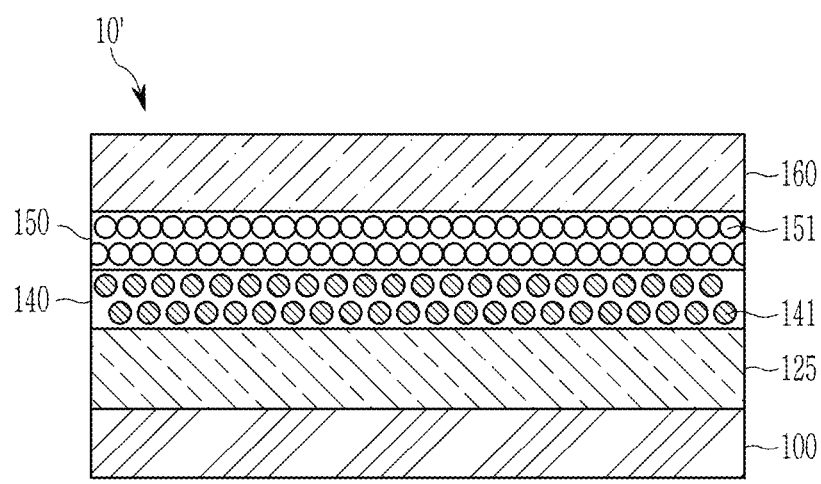
FIG. 4 is a cross-sectional view schematically showing an electroluminescent device according to an embodiment, FIG. 5 schematically shows an energy diagram of the first electrode, the electron transport layer, the light emitting layer, and the zinc oxide nanoparticle that is undoped or doped with the anion dopant of the electroluminescent device according to an embodiment.

FIG. 4 is a cross-sectional view schematically showing an electroluminescent device according to an embodiment. Referring to FIG. 4, the electroluminescent device 10' may further include a hole blocking layer 125 disposed between the first electrode 110 and the light emitting layer 140 instead of the hole injection layer and the hole transport layer.

In an embodiment, the hole blocking layer 125 may have a HOMO (highest occupied molecular orbital) energy level that is lower in energy than a HOMO energy level of the adjacent light emitting layer 140. Accordingly, the movement of holes from the light emitting layer 140 to the hole blocking layer 125 may be minimized or prevented. Moreover, the LUMO energy level of the hole blocking layer 125 may be higher than the LUMO energy level of the hole transport layer 130. Accordingly, the movement of electrons from the light emitting layer 140 to the hole blocking layer 125 may be minimized or prevented.

Hereinafter, an energy level improvement effect by the anion dopant of the aforementioned electroluminescent devices 10 and 10' is described with reference to FIG. 5.

Figure 5:
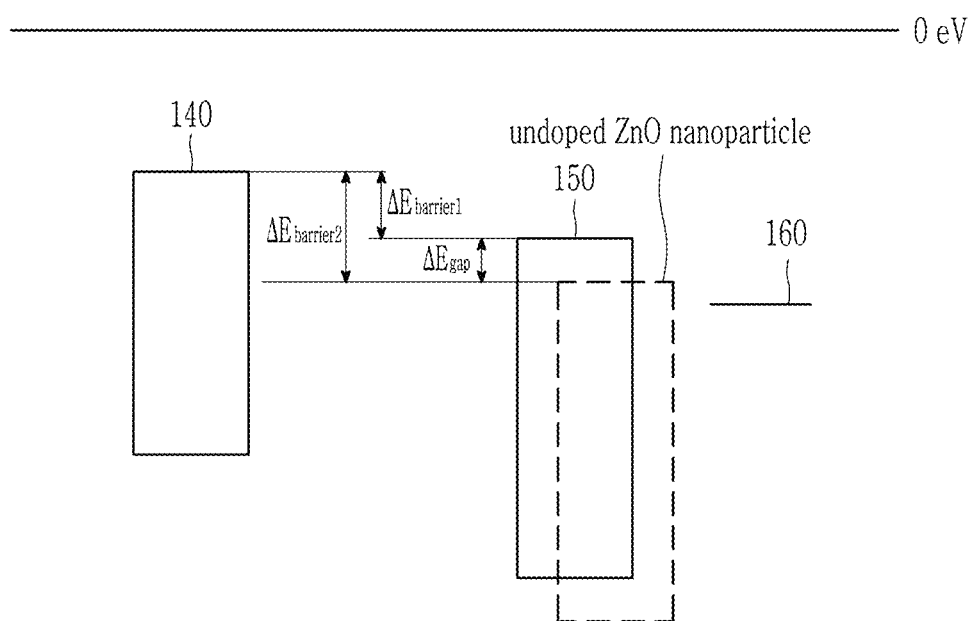

FIG. 5 schematically shows an energy diagram of the second electrode 160, the electron transport layer 150, the light emitting layer 140. Moreover, the zinc oxide nanoparticle in the electron transport layer can be undoped (dashed line) or doped (solid line) with the anion dopant of the according to an embodiment. Referring to FIG. 5, the electron transport layer 150 of the electroluminescent devices 10 and 10' has a LUMO energy level difference of $\Delta E_{barrier1}$ from the light emitting layer 140 in the presence of the dopant anion. In contrast, the zinc oxide nanoparticles undoped (or no dopant anion) has an energy level difference of $\Delta E_{barrier2}$ from the light emitting layer 140. The difference in the $\Delta E_{barrier1}$ and $\Delta E_{barrier2}$ is $\Delta E_{gap}$ as shown Because $\Delta E_{barrier1}$ and $\Delta E_{barrier2}$ work as an energy barrier to electrons injected into the light emitting layer 140, as the energy level difference increases, a trap level also increases, and accordingly, the transport of electrons into the light emitting layer 140 becomes more difficult, and instead, the electron can become trapped.

However, in the electroluminescent devices 10 and 10,' the electron transport layer 150 has a higher LUMO energy level compared with the conventional zinc oxide nanoparticles (absent the dopant anion), and thus, may relatively reduce the energy level difference from the light emitting layer 140. As a result, there is less of a barrier to electron transport, and the electroluminescent devices 10 and 10' may exhibit improved luminous efficiency.

Hereinafter, a display device including the electroluminescent device 10 is described.

A display device according to an embodiment includes a substrate, a driving circuit formed on the substrate, and a first electroluminescent device, a second electroluminescent device, and a third electroluminescent device spaced apart from each other in a predetermined interval and disposed on the driving circuit.

The first to third electroluminescent devices may have the same structure as the electroluminescent devices 10 and 10', but the wavelengths of the lights emitted from each quantum dots may be different from each other.

In an embodiment, the first electroluminescent device is a red device emitting red light, the second electroluminescent device is a green device emitting green light, and the third electroluminescent device is a blue device emitting blue light. In other words, the first to third electroluminescent devices may be pixels expressing red, green, and blue, respectively, in the display device.

However, an embodiment is not necessarily limited thereto, but the first to third electroluminescent devices may respectively express magenta, yellow, cyan, or may express other colors.

At least one of the first to third electroluminescent devices may be the electroluminescent devices 10 and 10.' In this case, the first electroluminescent device displaying red and/or the third electroluminescent device displaying blue may be the electroluminescent devices 10 and 10.'

In the display device according to an embodiment, a hole injection layer, a hole transport layer, an electron transport layer, an electron injection layer, and a hole blocking layer, and with the exception of the light emitting layer of each pixel, may be integrated to form a common layer. However, an embodiment is not limited thereto. A hole injection layer, a hole transport layer, an electron transport layer, an electron injection layer, and a hole blocking layer may be independently formed in each pixel of the display device, or at least one of a hole injection layer, a hole transport layer, an electron transport layer, an electron injection layer, and a hole blocking layer may form a common layer and remaining layers may form a separate independent layer.

The substrate may be a transparent insulating substrate or may be made of a ductile material. The substrate may include glass or a polymer material in a film having a glass transition temperature (Tg) of greater than about 150° C. For example, it includes a COC (cycloolefin copolymer) or COP (cycloolefin polymer) based material. All the first to third electroluminescent devices are formed on the substrate. That is, a substrate of the display device according to an embodiment provides a common layer.

The driving circuit is disposed on the substrate and is independently connected to each of the first to third electroluminescent devices. The driving circuit may include at least one line including a scan line, a data line, a driving power source line, a common power source line, and the like, at least two of thin film transistors (TFT) connected to the wire and corresponding to one organic light emitting diode, and at least one capacitor, or the like. The driving circuit may have a variety of the known structures.

As described above, a display device according to an embodiment may exhibit improved device efficiency and thus improved luminous efficiency.

Hereinafter, the embodiments are illustrated in more detail with reference to examples. These examples, however, are not in any sense to be interpreted as limiting the scope of the disclosure.

Preparation Example: Phosphorus (P)-Doped ZnO Core-Shell Nanoparticles 1 mmol of ZnO particles having an average particle diameter of 4.5 nm and 0.22 mmol of oleic acid are dissolved in hexane to obtain ZnO nanoparticles to which oleate ligands are attached.

The obtained ZnO particles are dispersed in hexane and re-dispersed in trioctylamine (TOA) and then, stirred and reacted with 10 wt % of tris(trimethylsilyl)phosphine [(TMS)3-P] at 200° C. to 300° C. for 30 minutes to synthesize phosphorus (P)-doped ZnO core-shell nanoparticles. The Preparation Example has a phosphorus (P) content of 10 wt % based on 100 wt % of the ZnO particles.

The synthesized phosphorus (P)-doped ZnO core-shell nanoparticles have an average particle diameter of 6.5 nm, which is increased from that of the initial ZnO particles, and an ICP (Inductively Coupled Plasma Spectrometer) analysis result shows a Zn:P mole ratio of 1:0.5.

Figure 6:
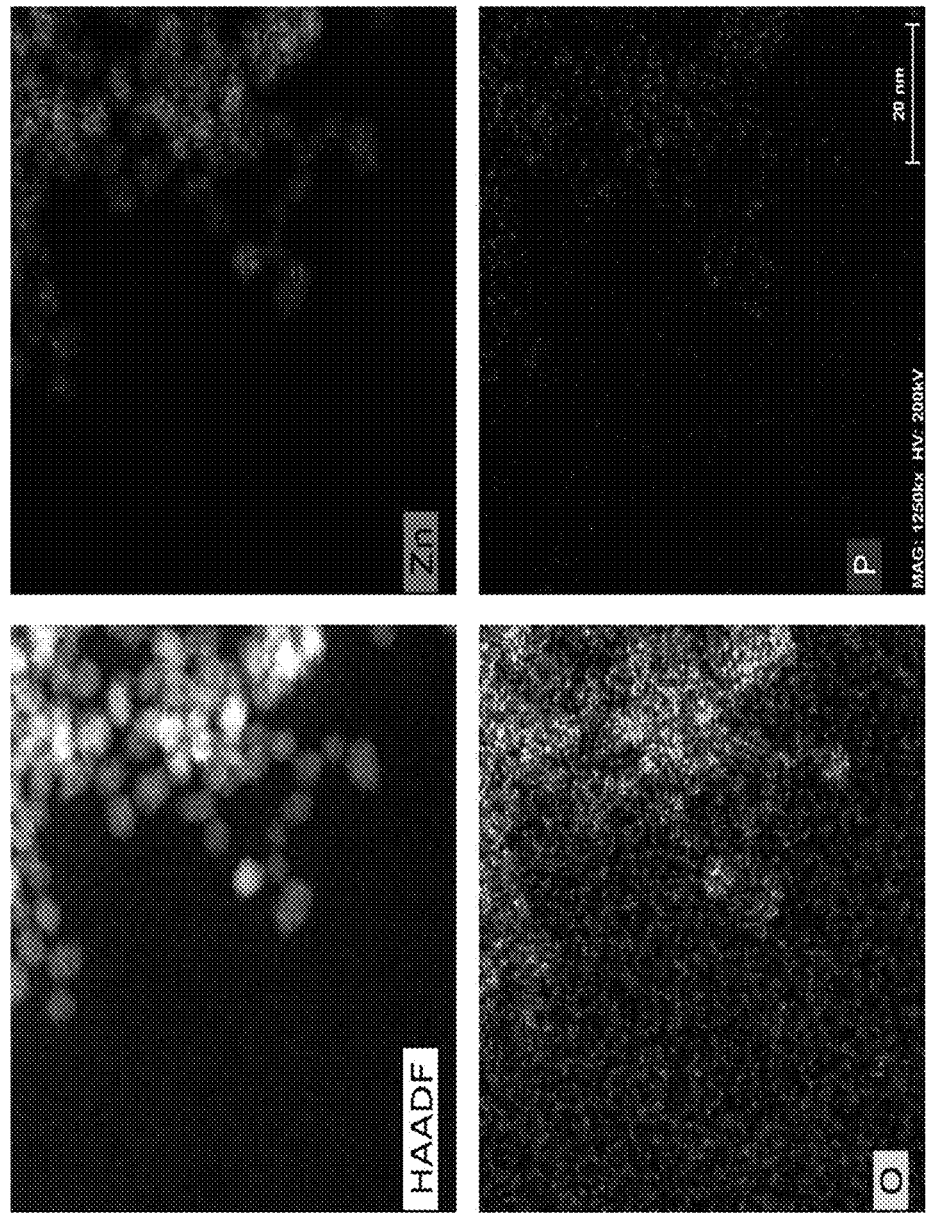
FIG. 6 shows STEM (scanning transmission electron microscopy) images of the phosphorus (P)-doped ZnO core-shell nanoparticles according to Preparation Example, wherein HAADF is a high-angle annular dark-field image of the phosphorus (P)-doped ZnO core-shell nanoparticles, and Zn, O and P are images respectively magnifying regions where the corresponding elements are distributed.

FIG. 6 exhibits a STEM (Scanning Transmission Electron Microscopy) image of the phosphorus (P)-doped ZnO core-shell nanoparticles according to the Preparation Example. The STEM image shows the phosphorus (P)-doped ZnO core-shell nanoparticles of the Preparation Example where 'HAADF' is a high-angle annular dark-field magnified image of the phosphorus (P)-doped ZnO core-shell nanoparticles, and Zn, O, and P regions where the elements are distributed within the nanoparticle. Referring to FIG. 6, 'HAADF' of the phosphorus (P)-doped ZnO core-shell nanoparticles indicates that Zn and O are distributed at positions corresponding to the core-shell nanoparticle, and phosphorus (P) is more associated with the distribution of Zn in the nanoparticle.

Accordingly, the STEM images of FIG. 6 indicate that the average particle diameter increases in the phosphorus (P)-doped ZnO core-shell nanoparticle of Preparation Example in comparison to undoped ZnO particles, and which further suggests that a shell layer including phosphorus (P) is formed in the ZnO particles.

Comparative Preparation Example: Undoped ZnO Nanoparticles 1 mmol of ZnO particles having an average particle diameter of 4.5 nm and 0.22 mmol of oleic acid are dissolved in hexane to obtain ZnO nanoparticles to which oleate ligands are attached.

Figure 7:
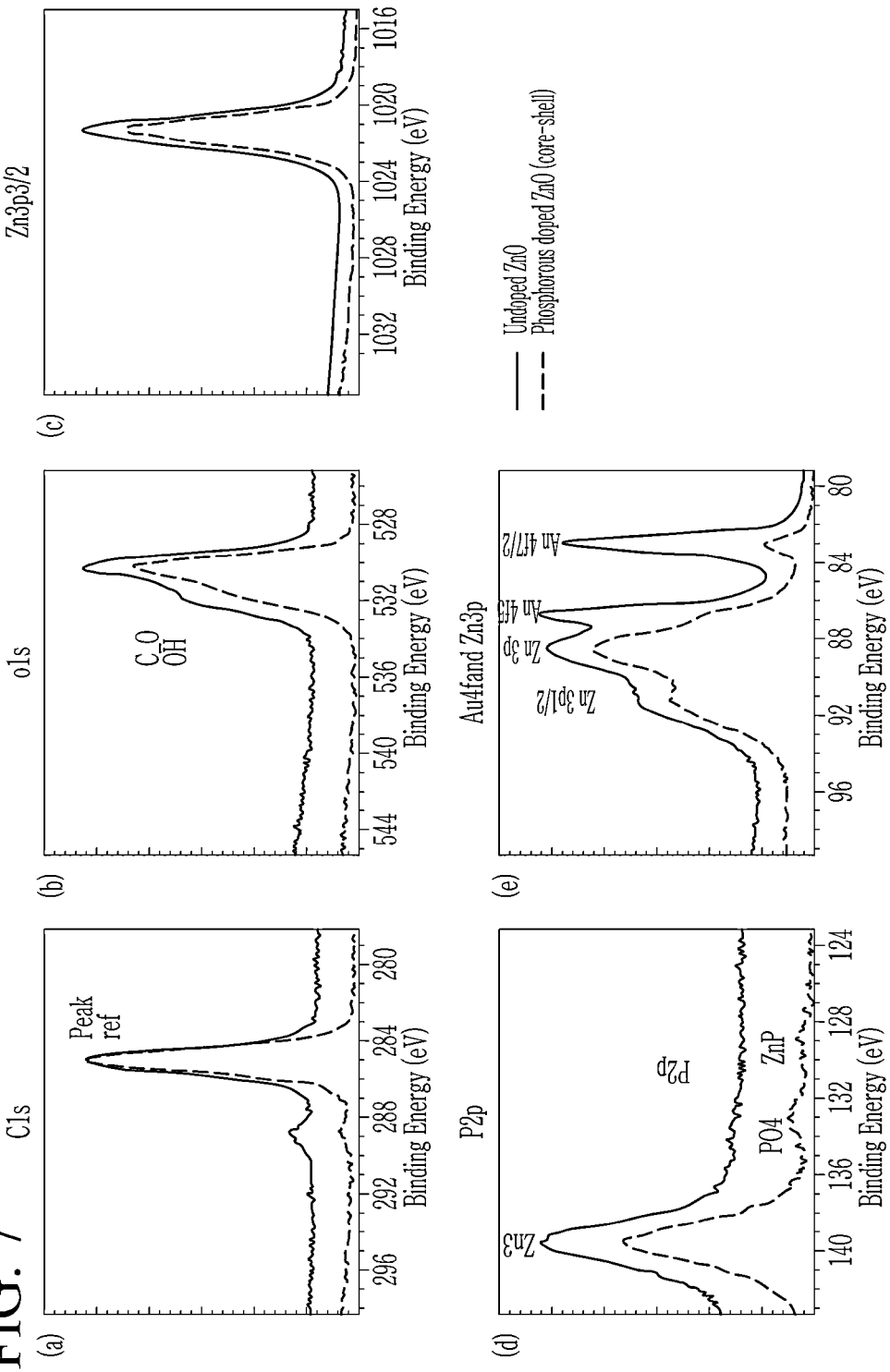
FIG. 7 shows X-ray photoelectron spectroscopy (XPS) analysis results of the phosphorus (P)-doped ZnO core-shell nanoparticles according to Preparation Example and the undoped ZnO nanoparticles according to Comparative Preparation Example.
Figure 8A:
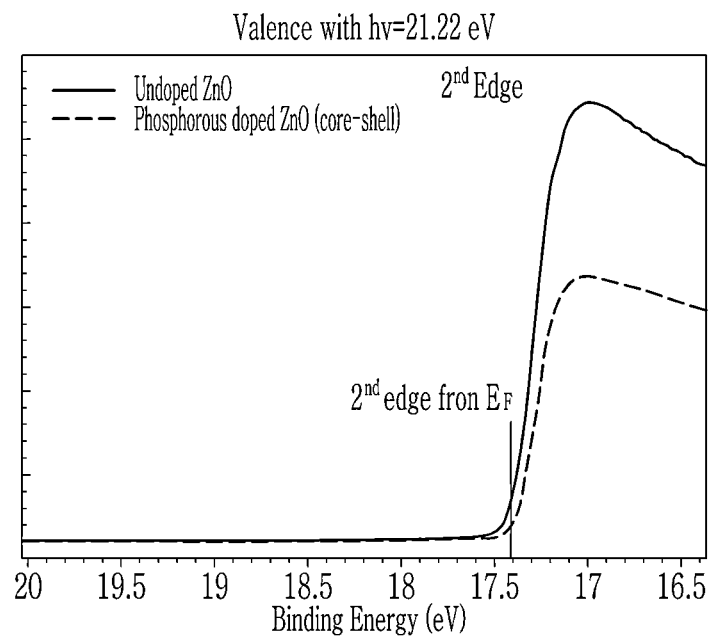
FIGS. 8A and 8B show UV (ultraviolet) photoelectron spectroscopy (UPS) analysis results of the phosphorus (P)-doped ZnO core-shell nanoparticles according to Preparation Example and the undoped ZnO nanoparticles according to Comparative Preparation Example.
Figure 8B:
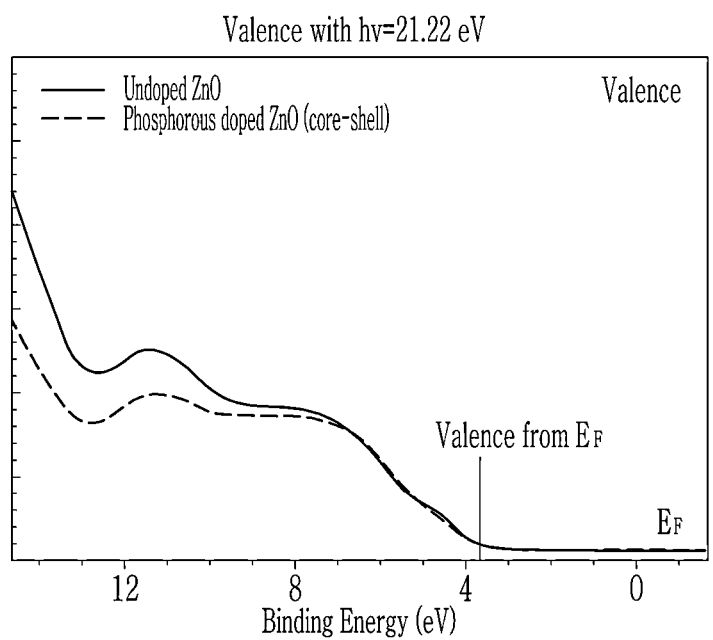

In addition, X-ray photoelectron spectroscopy (XPS) and UV photoelectron spectroscopy (UPS) are performed with respect to the phosphorus (P)-doped ZnO core-shell nanoparticles of Preparation Example and the undoped ZnO nanoparticle of Comparative Preparation Example, and the results are shown in FIGS. 7 and 8. In each plot, FIG. 7(a) to 7(e) exhibits the X-ray photoelectron spectroscopy (XPS) analysis results of the phosphorus (P)-doped ZnO core-shell nanoparticles of Preparation Example (dashed) overlapped with the undoped ZnO nanoparticles of Comparative Preparation Example (solid). The results of FIG. 7 are obtained by measuring each sample of the phosphorus (P)-doped ZnO core-shell nanoparticles of Preparation Example and the undoped ZnO nanoparticles of Comparative Preparation Example on a gold (Au) substrate.

Referring to FIG. 7, the phosphorus (P)-doped ZnO core-shell nanoparticles of Preparation Example and that of the ZnO nanoparticles of Comparative Preparation Example mostly exhibit a similar peak shape. However, as shown in the plot of 7(d), a $PO_4$ phase and a ZnP phase are observed in the ZnO nanoparticles of the Preparation Example and are not present in the undoped ZnO nanoparticle. Accordingly, in the phosphorus (P) doped ZnO core-shell nanoparticles of Preparation Example, the phosphorus (P) dopant forms a chemical bond with Zn, e.g., phase $PO_4$ as indicated and the like.

FIG. 8 exhibits UV photoelectron spectroscopy (UPS) analysis results of the phosphorus (P)-doped ZnO core-shell nanoparticles of Preparation Example and the undoped ZnO nanoparticles of Comparative Preparation Example. Referring to FIG. 8, the (P)-doped ZnO core-shell nanoparticles of Preparation Example (dashed) exhibit a 2nd edge of 17.39 eV, a valance of 3.66 eV, a work function of 3.83 eV, and IP of 7.47 eV, whereas the undoped ZnO nanoparticles of Comparative Preparation Example (solid) exhibit a 2nd edge of 17.41 eV, a valance of 3.70 eV, a work function of 3.81 eV, and IP of 7.51 eV. In other words, electron injection of the (P)-doped ZnO core-shell nanoparticles of Preparation Example becomes easier (is more facile) as the HOMO energy level becomes more shallow. Accordingly, referring to FIG. 8, the (P)-doped ZnO core-shell nanoparticles of Preparation Example exhibit a stable energy balance and an improved energy level compared with the undoped ZnO nanoparticles of Comparative Preparation Example.

EXAMPLE

An Electroluminescent Device (Electron Only)

A glass substrate deposited with ITO as a first electrode is surface-treated with UV-ozone for 15 minutes, and a solution of a hole blocking material is prepared by dispersing ZnMgO (an average particle diameter: 2 nm to 5 nm) in ethanol. The solution is spin-coated on the surface-treated ITO, and heat-treated at 80° C. for 30 minutes to form a 20 nm-thick hole blocking layer. A composition for a blue light emitting layer composition is prepared by dispersing a ZnTeSe/ZnSe/ZnS core-shell quantum dot to which oleate as a hydrophobic ligand is attached (an average particle diameter: 10 nm to 12 nm, a peak emission wavelength: 455 nm) in octane. The blue quantum dot composition is coated on the hole blocking layer, and heated at 80° C. to form a 20 nm-thick (blue) light emitting layer.

The phosphorus (P) doped ZnO core-shell nanoparticles of Preparation Example and mercaptoundecanol are mixed in ethanol to substitute a hydroxyundecane thiolate ligand for the oleate ligand attached to the phosphorus (P)-doped ZnO core-shell nanoparticles. Following the removal of the residues, the ligand substituted phosphorus (P)-doped ZnO core-shell nanoparticles are washed and re-dispersed in ethanol to prepare a solution for an electron transport layer. The solution for the electron transport layer is then spin-coated on the blue light emitting layer, and heat-treated at 80° C. for 30 minutes to form a 20 nm-thick electron transport layer. An aluminum layer is vacuum-deposited to form a 100 nm-thick second electrode on the electron transport layer. The manufactured electroluminescent device (Electron Only Device) according to Example (ITO/ZnMgO/Blue QD/Phosphorous doped ZnO/Al).

Comparative Example 1

An electroluminescent device (Electron Only) according to Comparative Example 1 (ITO/ZnMgO/Blue QD/ZnMgO/Al) is manufactured according to the same method as Example above except that ZnMgO nanoparticles to which hydroxyundecane thiolate ligands are attached (an average particle diameter: 2 nm to 5 nm) are used instead of the phosphorus (P)-doped ZnO core-shell nanoparticles of the Preparative Example (to which hydroxyundecane thiolate ligands are attached) as a solution in the preparation of the electron transport layer.

Comparative Example 2

An electroluminescent device (Electron Only) according to Comparative Example 2 (ITO/ZnMgO/Blue QD/undoped ZnO/Al) is manufactured according to the same method as Example except that undoped ZnO nanoparticles (to which hydroxyundecane thiolate ligands are attached; an average particle diameter: 2 nm to 5 nm) are used instead of the phosphorus (P)-doped ZnO core-shell nanoparticles to which hydroxyundecane thiolate ligands are attached as a solution for the making of the electron transport layer.

Figure 9:
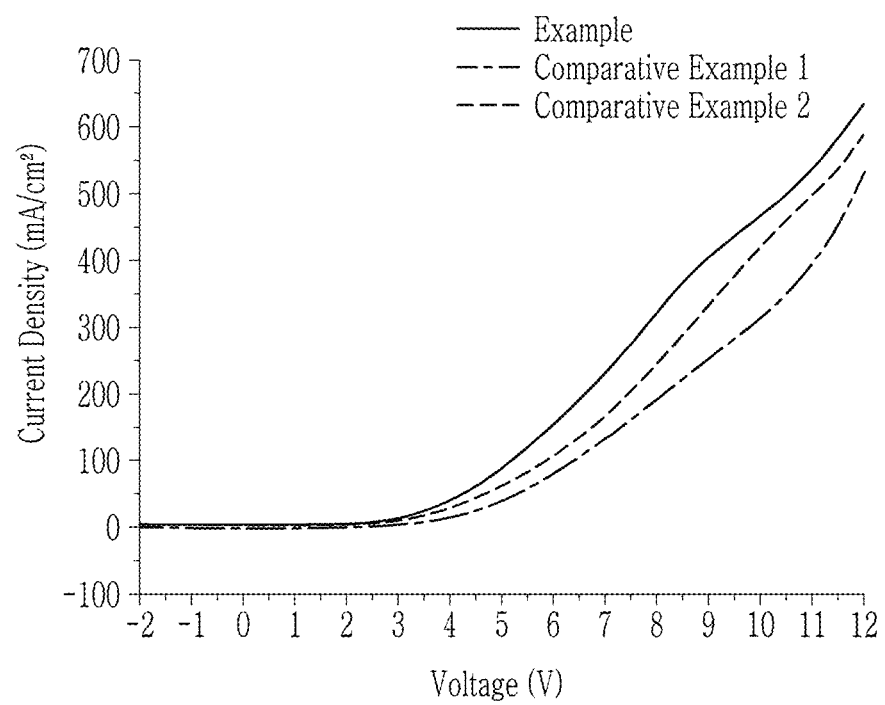
FIG. 9 is a graph showing voltage-current densities of electroluminescent devices according to an Example and Comparative Examples 1 and 2.

The electroluminescent devices according to Example and Comparative Examples 1 to 2 are respectively measured with respect to voltage-current density relationship, and the results are shown in FIG. 9.

FIG. 9 is a graph showing the voltage-current densities of the electroluminescent devices according to Examples and Comparative Examples 1 and 2.

On the other hand, each current density at 5 V, 8 V, and 12 V in FIG. 9 is shown in Table 1.

TABLE 1

|  | 5V | 8V | 12 V |
| --- | --- | --- | --- |
| Example | 86.97 | 318.61 | 635.70 |
| Comparative Example 1 | 39.39 | 193.96 | 536.36 |
| Comparative Example 2 | 61.78 | 256.45 | 593.96 |

Referring to FIG. 9 and Table 1, the electroluminescent device of Example exhibits excellent current density relative to a voltage compared with a case of introducing a metal cation-based dopant in ZnO nanoparticles (Comparative Example 1) and using undoped ZnO nanoparticles (Comparative Example 2). In other words, the electroluminescent device of Example may have a stable energy balance and an improved energy level by introducing an anion dopant such as phosphorus (P) and the like into an oxygen site (an O site) of the ZnO nanoparticles compared with the Comparative Examples.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

| Description of Symbols |
| --- |
| 10: electroluminescent device |
| 100: substrate |
| 110: first electrode |
| 120: hole injection layer |
| 130: hole transport layer |
| 140: light emitting layer |
| 141: quantum dot |
| 150: electron transport layer |
| 151: inorganic material nanoparticle |
| 160: second electrode |

What is claimed is:

1. An electroluminescent device comprising
a first electrode and a second electrode each having a surface opposite the other;
a light emitting layer disposed between the first electrode and the second electrode, the light emitting layer comprising quantum dots; and
an electron transport layer disposed between the light emitting layer and the second electrode, the electron transport layer comprising doped metal oxide nanoparticles,
wherein the doped nanoparticles comprise a dopant comprising P, N, C, Cl, F, Br, S, or a combination thereof, that is chemically bound to a metal of the metal oxide.

2. The electroluminescent device of claim 1, wherein the dopant is included in an amount of greater than 0 weight percent and less than or equal to about 50 weight percent based on 100 weight percent of the doped metal oxide nanoparticles.

3. The electroluminescent device of claim 1, wherein the dopant is included in an amount of less than or equal to about 10 weight percent based on 100 weight percent of the doped metal oxide nanoparticles.

4. The electroluminescent device of claim 1, wherein the dopant is included in an amount of about 10 weight percent to about 50 weight percent based on 100 weight percent of the doped metal oxide nanoparticles.

5. The electroluminescent device of claim 1, wherein the metal oxide comprises zinc oxide, and the dopant comprises $Zn_3P_2$, $Zn_3[(PO_4)]_2$, $ZnHPO_3$, $Zn_3N_2$, $ZnS$, $ZnSO_4$, $ZnCl_2$, $ZnBr_2$, $ZnF_2$, or a combination thereof.

6. The electroluminescent device of claim 5, wherein the doped metal oxide nanoparticles have a higher lowest unoccupied molecular orbital energy level than zinc oxide nanoparticles that do not include the anion dopant.

7. The electroluminescent device of claim 6, wherein the doped and non-doped metal oxide nanoparticles comprise a ligand comprising derived from a carboxylic acid, a compound derived from a thiol, or a combination thereof, that is attached to a surface of the doped metal oxide nanoparticles.

8. The electroluminescent device of claim 1, wherein the electron transport layer comprises at least two different layers with each layer including the doped metal oxide nanoparticles.

9. The electroluminescent device of claim 1, wherein the electroluminescent device further comprises a hole blocking layer disposed between the first electrode and the light emitting layer.

10. The electroluminescent device of claim 9, wherein the lowest unoccupied molecular orbital energy level of the hole blocking layer is higher than the lowest unoccupied molecular orbital energy level of a hole transport layer.

11. The electroluminescent device of claim 9, wherein the hole blocking layer comprises an inorganic oxide nanoparticle, a quinolone compound, a triazine-based compound, a quinoline-based compound, a triazole-based compound, a naphthalene-based compound, or a combination thereof.

12. The electroluminescent device of claim 1, wherein the quantum dots have a core-shell structure, and the core of the quantum dots comprise a first semiconductor nanocrystal, and the shell of the quantum dots comprise a second semiconductor nanocrystal having a composition different from that of the first semiconductor nanocrystal.

13. The electroluminescent device of claim 12, wherein the first semiconductor nanocrystal and the second semiconductor nanocrystal independently comprise a Group II-VI compound that does not comprise cadmium, a Group III-V compound, a Group IV-VI compound, a Group IV element or compound, a Group I-III-VI compound, a Group I-II-IV-VI compound that does not comprise cadmium, or a combination thereof.

14. The electroluminescent device of claim 1, wherein the quantum dots emit light of a first wavelength region of about 380 nanometers to about 489 nanometers, a second wavelength region of about 490 nanometers to about 510 nanometers, a third wavelength region of about 511 nanometers to about 581 nanometers, a fourth wavelength region of about 582 nanometers to about 610 nanometers, or a fifth wavelength region of about 611 nanometers to about 680 nanometers.

15. The electroluminescent device of claim 1, wherein the doped metal oxide nanoparticles comprise a ligand comprising a compound derived from metal halide, a compound derived from carboxylic acid, a compound derived from thiol, or a combination thereof, that is attached to a surface of the quantum dots.

16. The electroluminescent device of claim 1, wherein
a functional layer is further disposed between the first electrode and the second electrode,
wherein the functional layer comprises a hole transport layer, a hole injection layer, an electron blocking layer, an electron injection layer, or a combination thereof.

17. The electroluminescent device of claim 16, wherein the hole transport layer comprises a poly(3,4-ethylenedioxythiophene) derivative, a poly(styrenesulfonate) derivative, a poly-N-vinylcarbazole derivative, a polyphenylenevinylene derivative, a polyparaphenylenevinylene derivative, a polymethacrylate derivative, a polyarylamine derivative, a polyaniline derivative, a polypyrrole derivative, a poly(9,9-dioctylfluorene) derivative, a poly(spiro-bifluorene) derivative, tris(4-carbazol-9-yl phenyl)amine, N,N'-diphenyl-N,N'-bis(3-methylphenyl)-(1,1'-biphenyl)-4,4'-diamine, N,N'-di(naphthalen-1-yl)-N—N'-diphenyl-benzidine, tris(3-methylphenylphenylamino)-triphenylamine, dipyrazino[2,3-f:2',3'-h]quinoxaline-2,3,6,7,10,11-hexacarbonitrile, poly(N,N'-diphenyl-N,N'-bis(3-methylphenyl)-(1,1'-biphenyl)-4,4'-diamine), NiO, $MoO_3$, or a combination thereof.

18. A display device comprising the electroluminescent device of claim 1.

* * * * *